(12) United States Patent
Xie et al.

(10) Patent No.: US 11,482,617 B2
(45) Date of Patent: Oct. 25, 2022

(54) VERTICAL TRANSPORT FIELD-EFFECT TRANSISTOR INCLUDING REPLACEMENT GATE

(71) Applicant: International Business Machines Corporation, Armonk, NY (US)

(72) Inventors: Ruilong Xie, Niskayuna, NY (US); Chen Zhang, Guilderland, NY (US); Kangguo Cheng, Schenectady, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/821,958

(22) Filed: Mar. 17, 2020

(65) Prior Publication Data
US 2021/0296494 A1    Sep. 23, 2021

(51) Int. Cl.
| | |
|---|---|
| H01L 29/78 | (2006.01) |
| H01L 21/8238 | (2006.01) |
| H01L 27/088 | (2006.01) |
| H01L 21/8234 | (2006.01) |
| H01L 29/66 | (2006.01) |
| H01L 27/092 | (2006.01) |

(52) U.S. Cl.
CPC .. *H01L 29/7827* (2013.01); *H01L 21/823487* (2013.01); *H01L 21/823814* (2013.01); *H01L 21/823821* (2013.01); *H01L 21/823885* (2013.01); *H01L 27/088* (2013.01); *H01L 27/0924* (2013.01); *H01L 29/66545* (2013.01); *H01L 29/66666* (2013.01); *H01L 29/66795* (2013.01); *H01L 29/785* (2013.01)

(58) Field of Classification Search
CPC .............. H01L 27/092; H01L 27/0924; H01L 29/7827; H01L 29/66666; H01L 29/66795; H01L 29/66545; H01L 21/823885; H01L 21/823821; H01L 21/823814; H01L 21/823828; H01L 27/088; H01L 21/823487; H01L 21/823418; H01L 21/823425; H01L 29/78642

See application file for complete search history.

(56) References Cited

U.S. PATENT DOCUMENTS

| | | | |
|---|---|---|---|
| 7,683,428 B2 * | 3/2010 | Chidambarrao | .. H01L 29/66787 257/347 |
| 9,496,379 B2 * | 11/2016 | Leobandung | ..... H01L 29/66553 |
| 9,525,064 B1 | 12/2016 | Balakrishnan et al. | |
| 9,627,535 B2 | 4/2017 | Xie et al. | |
| 9,685,537 B1 | 6/2017 | Xie et al. | |

(Continued)

*Primary Examiner* — Michael M Trinh
(74) *Attorney, Agent, or Firm* — Abdy Raissinia; Otterstedt & Kammer PLLC

(57) ABSTRACT

A vertical transport field-effect transistor array includes continuous spacers at cell edges that are formed following a replacement metal gate process. Techniques for fabricating the transistor array include forming trenches extending along the fin edges of the array to provide access to sacrificial gates, replacing the sacrificial gates with gate stacks, and forming the continuous spacers to encapsulate the gate stacks once formed. Removal of interlevel dielectric material from the array is not required for gate replacement. Bottom source/drain contacts may be formed in the trenches and in adjoining relation to the continuous spacers.

10 Claims, 15 Drawing Sheets

(56) References Cited

U.S. PATENT DOCUMENTS

| | | | |
|---|---|---|---|
| 9,773,708 B1 | 9/2017 | Zhang et al. | |
| 9,780,197 B1 | 10/2017 | Xie et al. | |
| 9,780,208 B1 | 10/2017 | Xie et al. | |
| 9,793,273 B2 * | 10/2017 | Liaw | H01L 21/76224 |
| 9,859,421 B1 | 1/2018 | Robison et al. | |
| 9,882,047 B2 | 1/2018 | Leobandung | |
| 9,960,254 B1 | 5/2018 | Bao et al. | |
| 10,103,247 B1 | 10/2018 | Xie et al. | |
| 2017/0317177 A1 * | 11/2017 | Mallela | H01L 21/823828 |
| 2019/0393342 A1 * | 12/2019 | Xie | H01L 29/66666 |
| 2020/0006528 A1 | 1/2020 | Cheng et al. | |
| 2020/0066903 A1 * | 2/2020 | Bao | H01L 29/66545 |

* cited by examiner

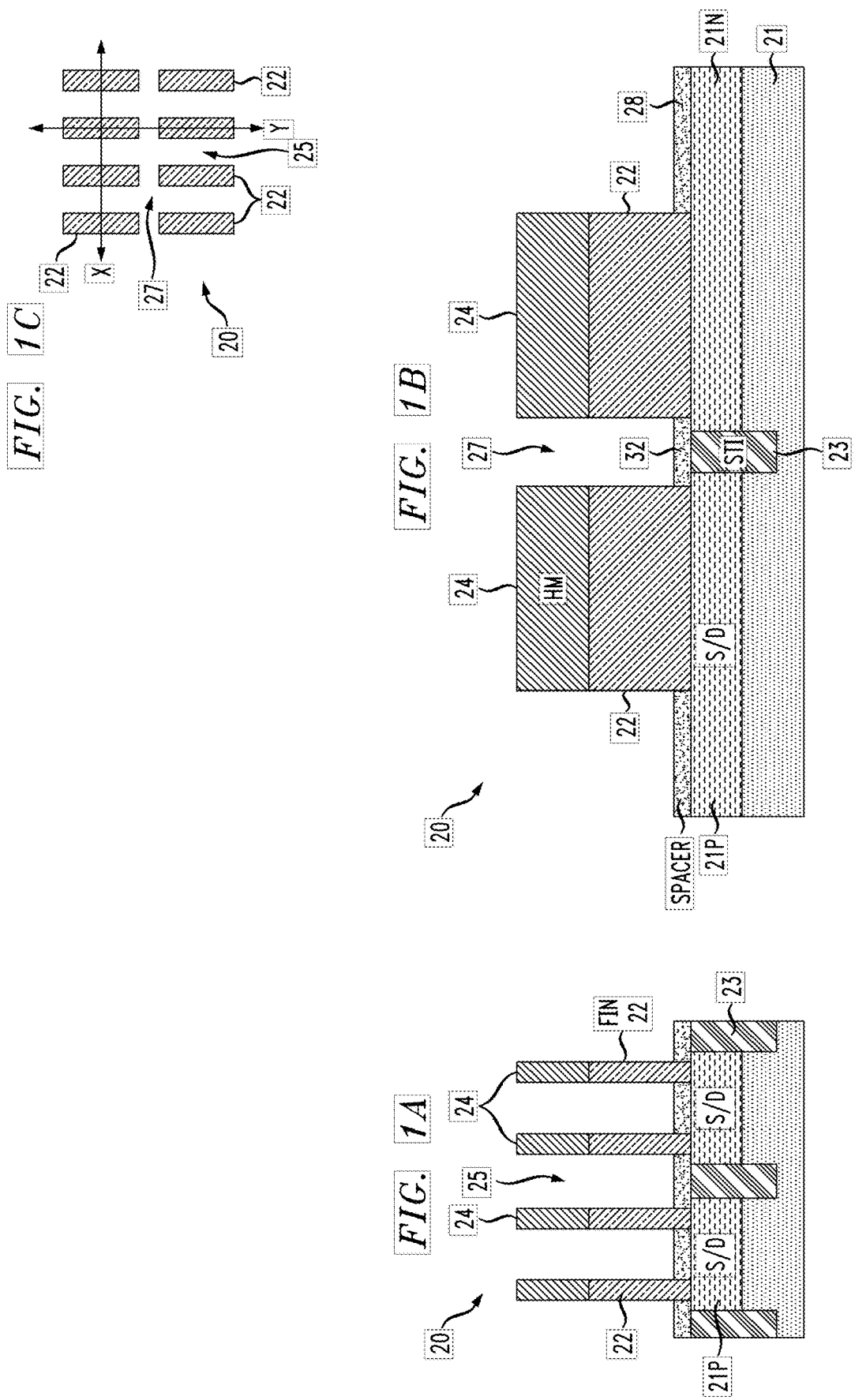

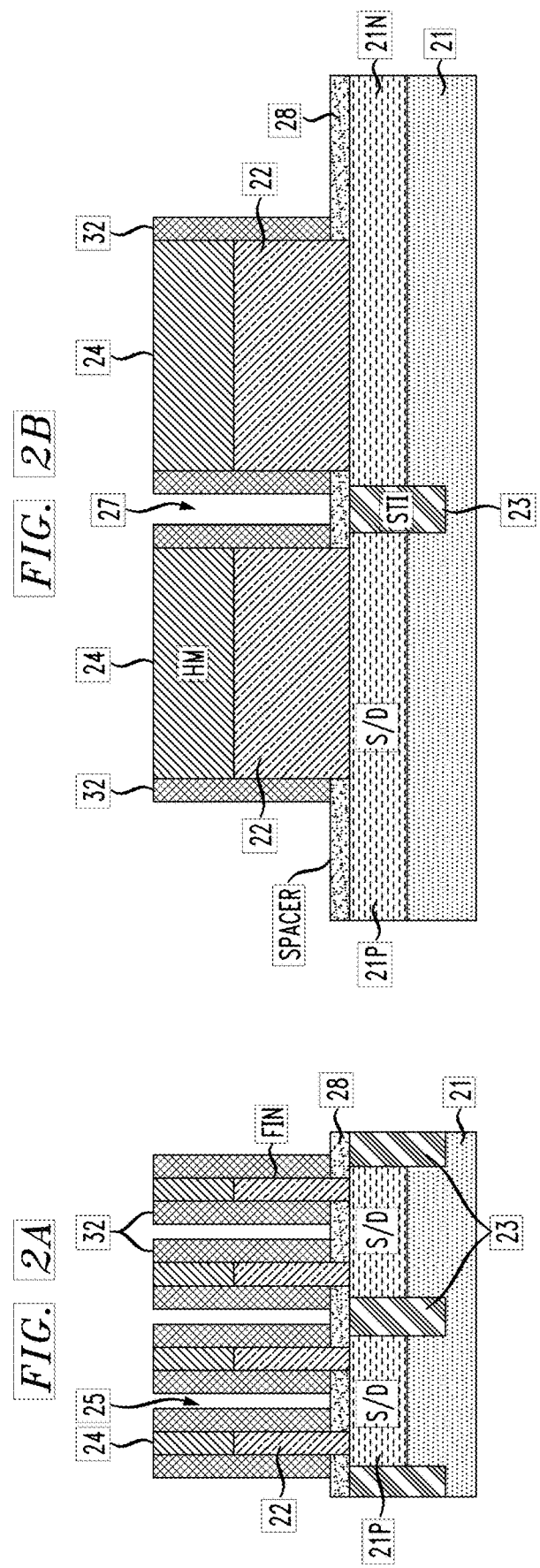

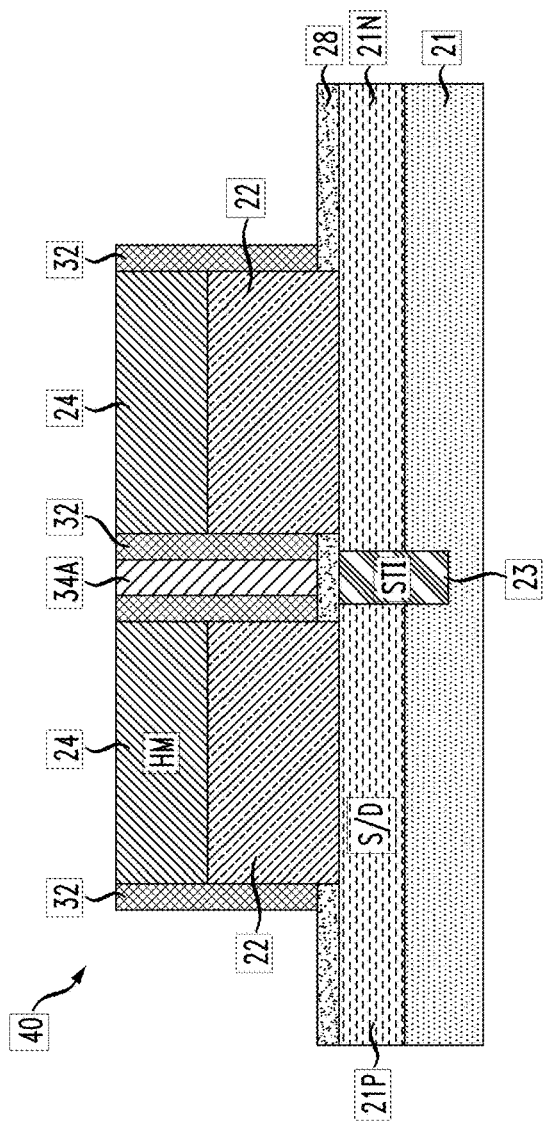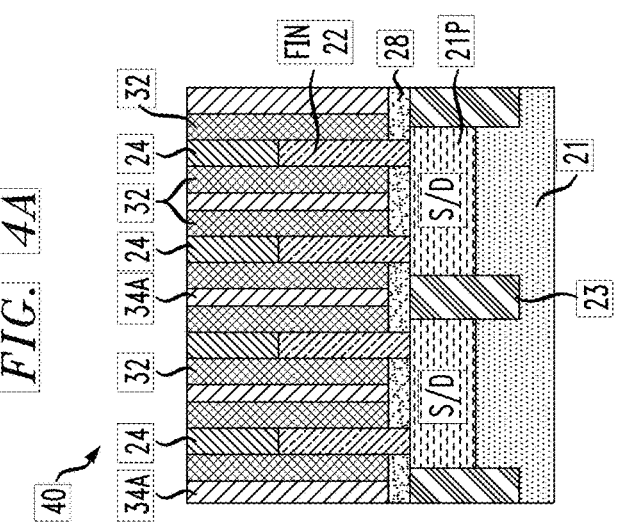

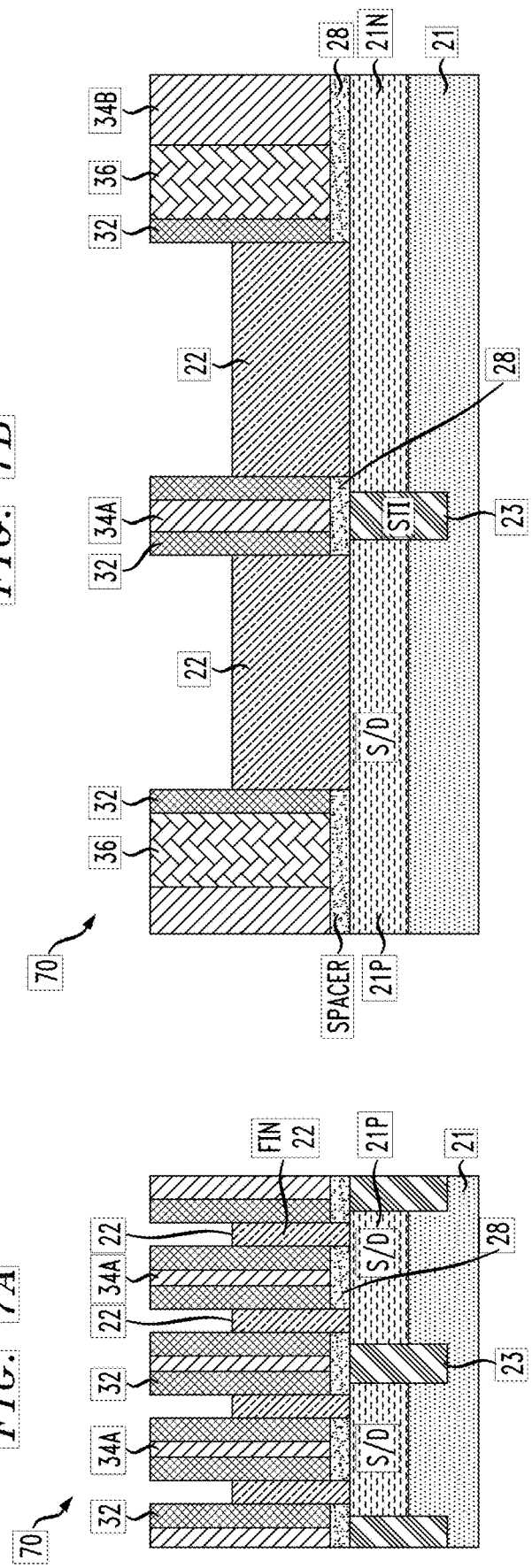

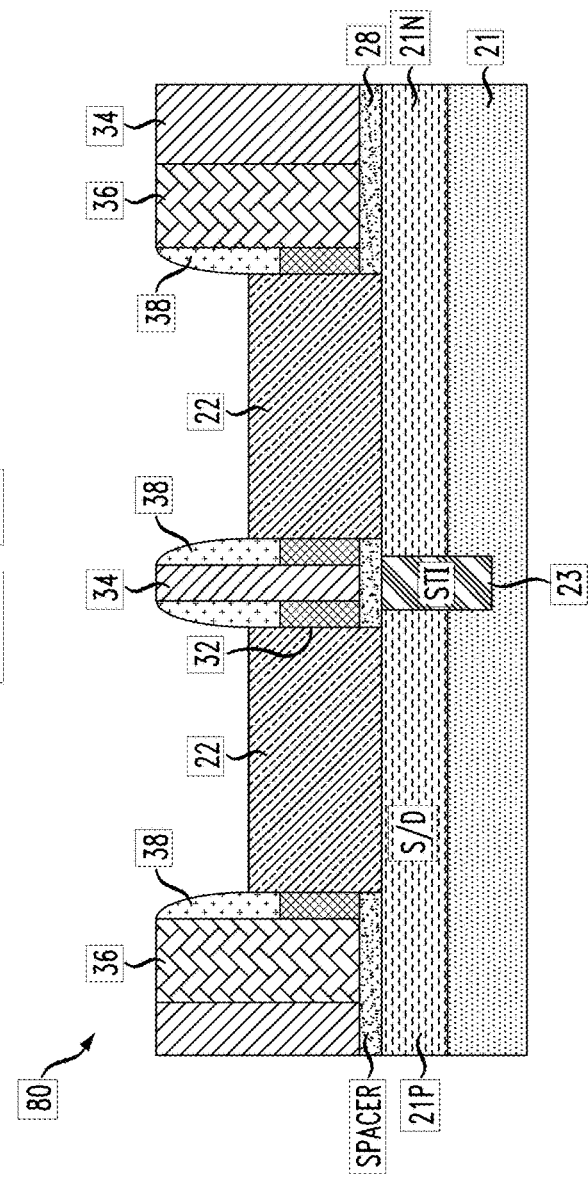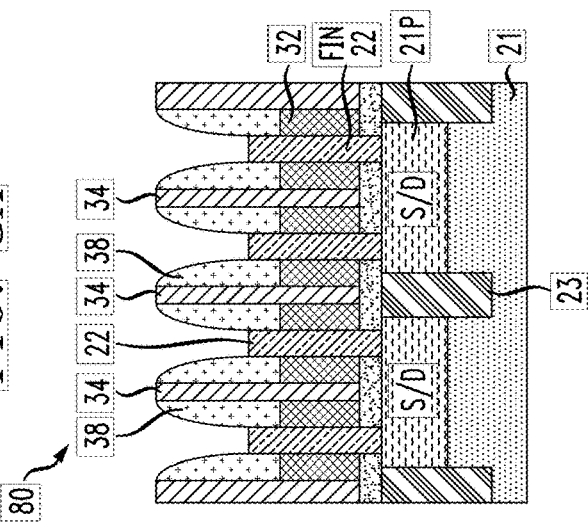

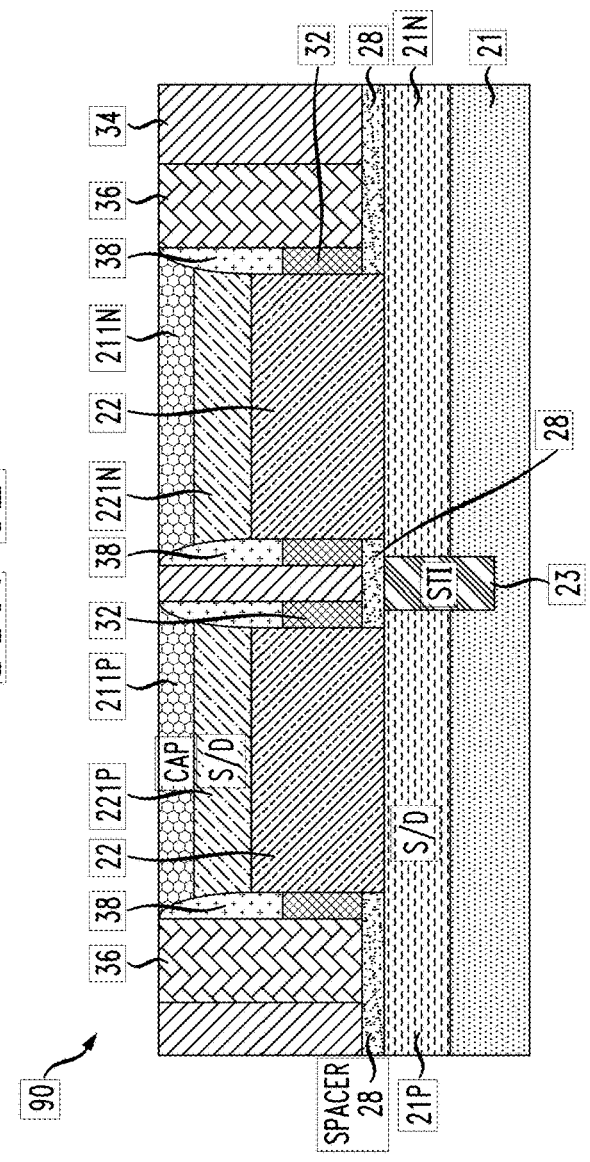
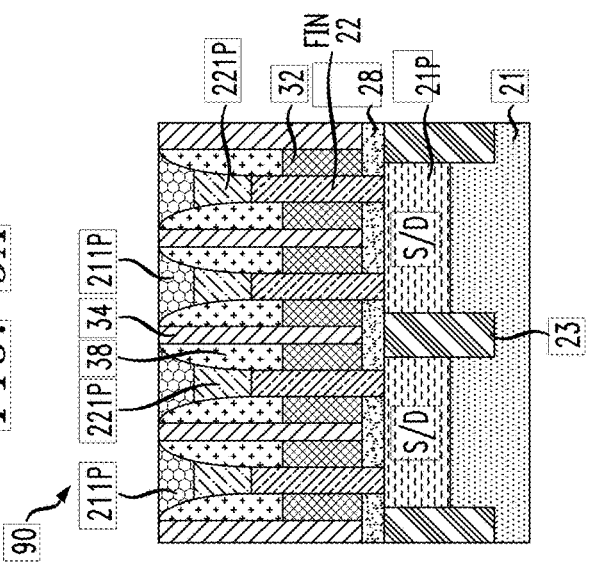

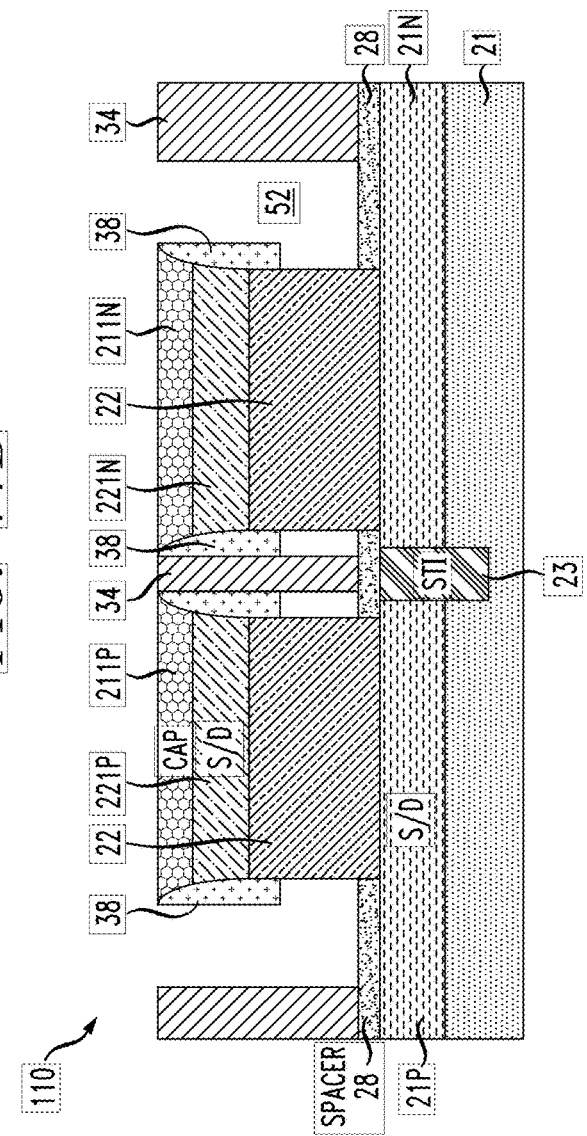
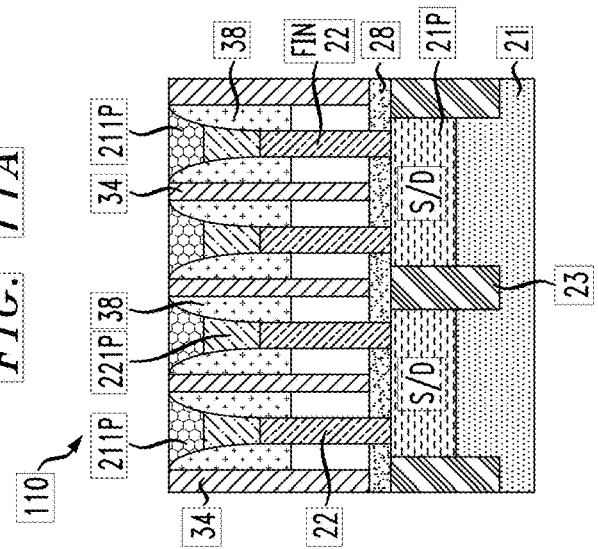

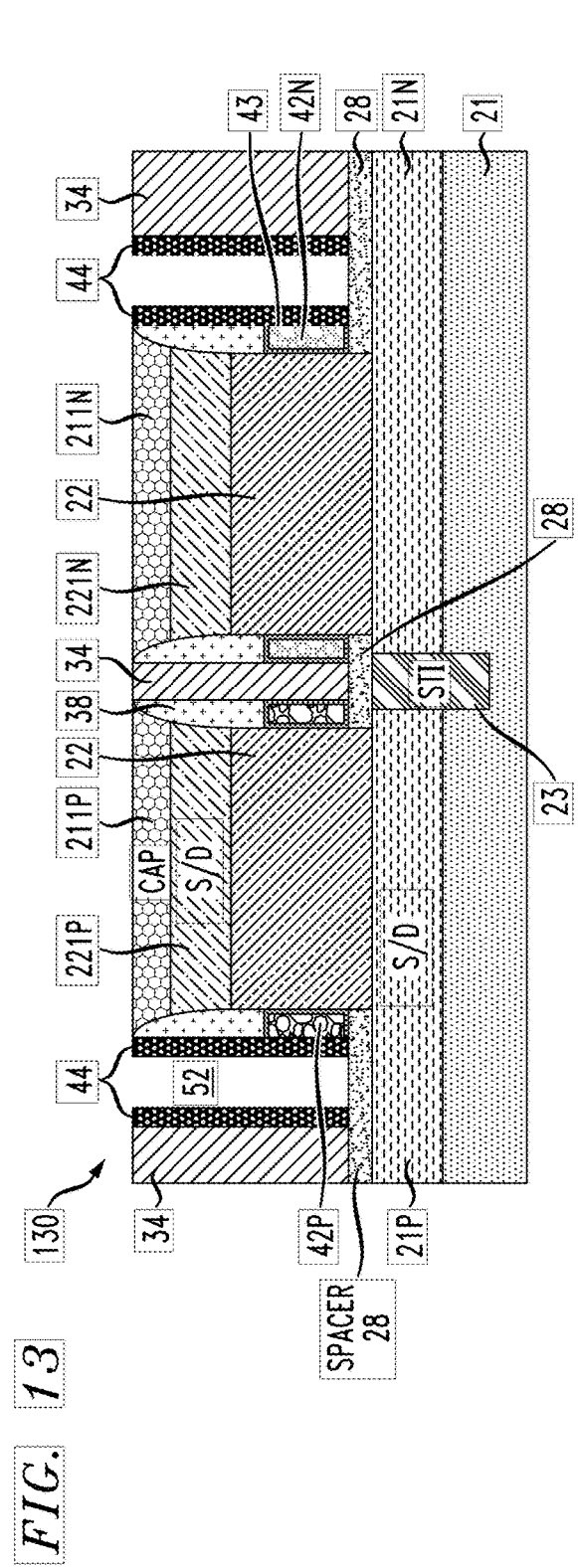
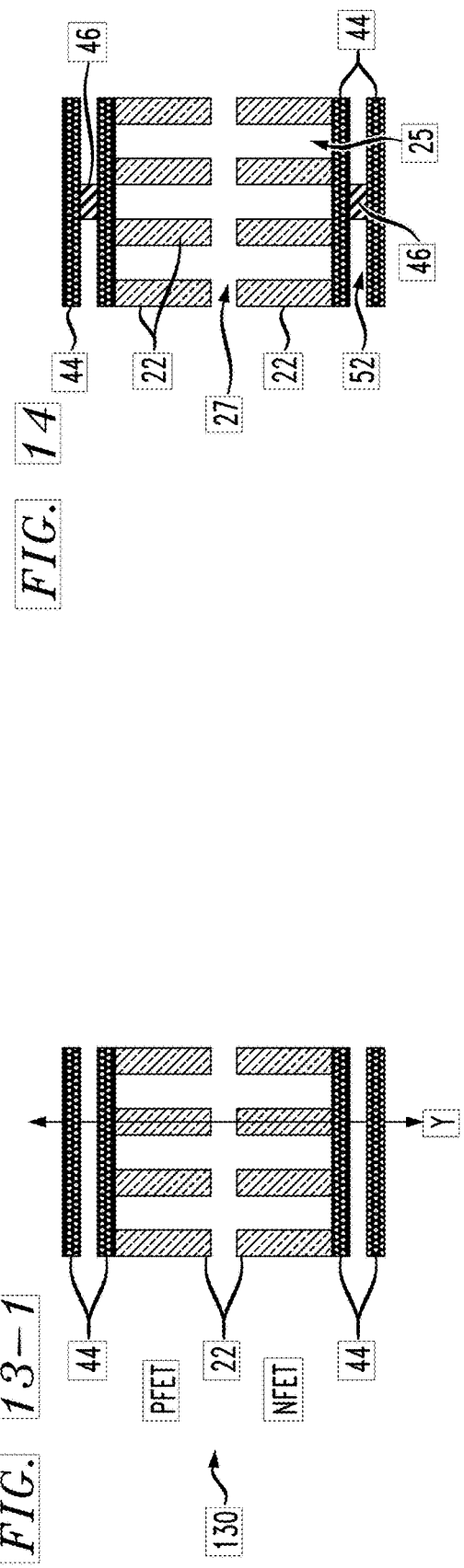

VERTICAL TRANSPORT FIELD-EFFECT TRANSISTOR INCLUDING REPLACEMENT GATE

BACKGROUND

The present invention relates generally to the electrical, electronic and computer arts and, more particularly, to vertical transistor structures.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region.

Vertical transport FETs (VTFETs) are a promising alternative to standard lateral FET structures due to potential benefits, among others, in terms of reduced circuit footprint. A logic circuit comprising VTFETs can be referred to as a "vertical transport logic gate." VTFETs can potentially provide electronic devices comprising logic circuits with improved circuit density. Such logic circuits can be characterized by a lower-number CPP (cell gate pitch) versus comparable logic circuits comprising lateral FET layouts. Minimum wiring pitch can also be relevant for realizing denser vertical FET layouts.

Gate stacks for VTFETs can be formed using various processes, including replacement metal gate (RMG) technology. An exemplary RMG process includes forming a vertical structure including a dummy gate between bottom and top source/drain regions. The dummy gate is removed to expose the channel region of the structure. An exemplary structure 100A following dummy gate removal is schematically illustrated in FIG. 16A. A high-κ metal gate (HKMG) process is then employed to deposit a gate stack on the channel region to obtain a structure 100B as shown in FIG. 16B. The exemplary structures 100A, 100B include adjacent semiconductor fins 102 that are employed as VTFET channel regions. The fins extend vertically between bottom and top source/drain regions 104A, 104B. Bottom spacers extend 106A over the bottom source/drain regions 104A and top spacers 106B encapsulate the top source/drain regions. Shallow trench isolation (STI) regions 108 extend within the substrate 112 and electrically isolate adjoining devices. The distance between the inner surfaces of adjoining top spacers 106B is relatively narrow compared to the distance between the fins. In structure having a 36 nanometer fin pitch, the distance (d2) between opposing surfaces of adjoining fins may be about 28 nanometers. The top spacers 106B extend at least seven (7) nanometers (d1) from the fin surfaces, which results in the relatively narrow spaces above the exposed (channel) portions of the semiconductor fins 102. HKMG deposition may cause early "pinch-off" or closure of the narrow spaces prior to complete deposition of the gate stack over the channel regions of the semiconductor fins. The "pinch-off" area is indicated by an oval outline in FIG. 16B. As further shown in FIG. 16B, cavities are formed beneath the pinched off spaces as no further HKMG material 114 can be deposited beneath them. The cavities may not be uniform in size. The VTFETs formed in such a process may have less than ideal uniformity in electrical characteristics such as threshold voltage (Vt).

BRIEF SUMMARY

Monolithic semiconductor structures including one or more vertical transport FETs and fabrication of such structures are aspects of inventions disclosed herein.

In one aspect, an exemplary method of forming replacement gates for vertical transport field-effect transistors includes forming a sacrificial gate liner on parallel semiconductor fins arranged in nFET and pFET regions within a cell, forming a first dielectric layer pinching off spaces between the parallel semiconductor fins and between the nFET and pFET regions, forming a sacrificial spacer at an edge of the cell and abutting the sacrificial gate liner, and forming a top spacer layer. Top source/drain layers are formed on the semiconductor fins between portions of the top spacer layer. The sacrificial spacer is removed and the sacrificial gate liner is replaced with a gate stack including a gate dielectric layer and gate metal. The gate stack is then encapsulated with a first continuous dielectric spacer.

A further method of forming replacement gates for vertical transport field-effect transistor structures includes obtaining a semiconductor structure including a plurality of parallel, vertically extending semiconductor fins, each of the semiconductor fins including side walls, end walls, and a channel region, bottom source/drain regions adjoining, respectively, each of the semiconductor fins, top source/drain regions adjoining, respectively, each of the semiconductor fins, sacrificial gates extending, respectively, around the channel region of each of the semiconductor fins, and an interlevel dielectric layer having portions extending between the side walls of the semiconductor fins. A trench is formed in the semiconductor structure that extends perpendicularly to the semiconductor fins and in opposing relation to the end walls of the semiconductor fins, thereby exposing portions of the sacrificial gates. The sacrificial gates are selectively removed, thereby exposing the channel regions of the semiconductor fins and forming spaces between the side walls of the semiconductor fins and the portions of the interlevel dielectric layer. A gate stack is deposited over the channel regions of the semiconductor fins. The gate stack includes a gate dielectric layer and a work function metal layer within the spaces.

In a further aspect, vertical device includes a cell comprising nFET and pFET regions and vertical transport field-effect transistors within the nFET and pFET regions. The vertical transport field-effect transistors include gate stacks comprising gate dielectric layers and gate metal layers. A first cell edge adjoins the nFET region and includes a first pair of continuous dielectric spacers. One of the first pair of continuous dielectric spacers is in direct contact with the gate metal layers in the nFET region. A second cell edge adjoins the pFET region and includes a second pair of continuous dielectric spacers, one of the second pair of continuous dielectric spacers being in direct contact with the gate metal layers in the pFET region. A first electrically conductive bottom source/drain contact is within a first trench between the first pair of continuous dielectric spacers and a second electrically conductive bottom source/drain contact is within a second trench between the second pair of continuous dielectric spacers.

In accordance with further aspects of the invention, an array of vertical transport field-effect transistors a semiconductor substrate and parallel semiconductor fins extending vertically with respect to the semiconductor substrate. Each of the semiconductor fins includes side walls and inner and outer end walls. The array further includes a plurality of the vertical transport field-effect transistors. Each of the VTFETs includes a bottom source/drain region, a top source/drain region, and a channel between the bottom source/drain region and the top source/drain region. The channel includes a channel region of one of the semiconductor fins. A gate stack adjoins the channel region. A first pair of parallel, continuous dielectric side wall spacers extends perpendicularly with respect to the semiconductor fins and vertically with respect to the semiconductor substrate. The first pair of parallel, continuous dielectric side wall spacers is proximal to the outer end walls of a first plurality of the semiconductor fins and bounds a first trench. One of the first pair of parallel, continuous dielectric side wall spacers adjoins a plurality of the gate stacks of a first plurality of the vertical field-effect transistors. A second pair of parallel, continuous dielectric side wall spacers extending perpendicularly with respect to the semiconductor fins and vertically with respect to the semiconductor substrate is proximal to the outer end walls of a second plurality of the semiconductor fins and bounding a second trench. One of the second pair of parallel, continuous dielectric side wall spacers adjoins a plurality of the gate stacks of a second plurality of the vertical field-effect transistors. A first bottom source/drain contact layer is between the first pair of parallel, continuous side wall spacers and a second bottom source/drain contact layer is between the second pair of parallel, continuous side wall spacers. A first recess extends vertically from the first trench into the semiconductor substrate and is filled with electrically insulating material. The first bottom source/drain contact layer includes a first portion on one side of the first recess and a second portion electrically isolated from the first portion on an opposite side of the first recess. A second recess extends vertically from the second trench into the semiconductor substrate and is also filled with electrically insulating material. The second bottom source/drain contact layer includes a first portion on one side of the second recess and a second portion electrically isolated from the first portion on an opposite side of the second recess.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Operational benefits of VTFETs;
Reduction in inversion layer thickness (Tiny);
Enhanced uniformity of electrical characteristics.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 1A and 1B are sectional views taken along lines X and Y, respectively, of FIG. 1C showing a finned structure following formation of bottom source/drain regions and a bottom spacer layer;

FIG. 1C is a top plan view showing a portion of a monolithic structure including sets of parallel semiconductor fins arranged in nFET and pFET regions;

FIGS. 2A and 2B are sectional views showing the structure of FIGS. 1A and 1B, respectively, formation of sacrificial spacers on sidewalls of the semiconductor fins;

FIGS. 4A and 4B are sectional views showing the structure of FIGS. 3A and 3B, respectively, following isotropic etch-back of the fill layer;

FIGS. 7A and 7B are sectional views showing the structure of FIG. 6 following selective removal of a hard mask over the semiconductor fins;

FIGS. 8A and 8B are sectional views showing the structure of FIGS. 7A and 7B, respectively, following indentation of the sacrificial spacers on the sidewalls of the semiconductor fins and top spacer formation;

FIGS. 9A and 9B are sectional views showing the structure of FIGS. 8A and 8B, respectively, following top source/drain epitaxy and epitaxial cap formation;

FIGS. 11A and 11B are sectional views showing the structure of FIGS. 10A and 10B, respectively, following removal of the remaining portions of the sacrificial spacer elements;

FIG. 13 is a sectional view showing the structure of FIG. 12B following formation of inner spacers within the edge portions of the structure;

FIG. 13-1 is a top plan view showing selected elements of the structure shown in FIG. 13;

FIG. 14 is a top plan view showing the structure of FIG. 13-1 following formation of cut regions between pairs of the inner spacers;

Figure 3B:
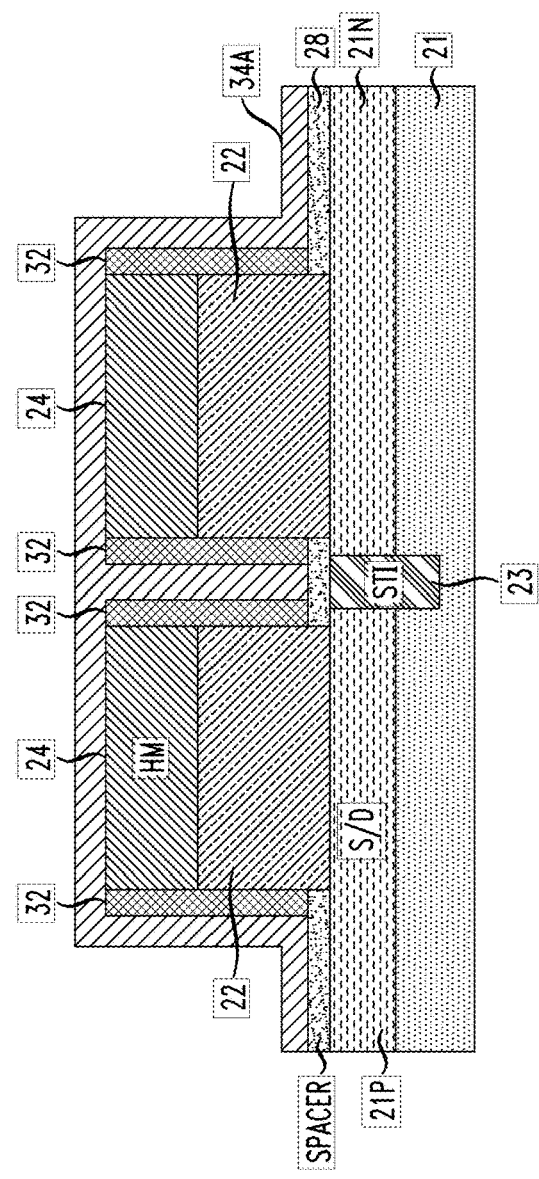
FIGS. 3A and 3B are sectional views showing the structure of FIGS. 2A and 2B, respectively, following deposition of a fill layer thereon.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A semiconductor structure 20 including a bulk semiconductor substrate 21 comprised of crystalline silicon and including nFET and pFET regions is shown in FIGS. 1A and 1B. The substrate may be in the form of a wafer that is essentially undoped, but may contain some impurities. An array of parallel semiconductor fins 22 is formed from the substrate using, for example, a sidewall image transfer process. A hard mask may be deposited over the substrate, including any features thereon, using conventional deposition techniques such as spin-on coating, CVD, plasma-assisted CVD, or other known techniques. The fins 22 are formed beneath portions of the hard mask that remain on the structure following mask patterning. Semiconductor fins 22 extending vertically with respect to the substrate are formed following partial removal of substrate material by an etching process such as a reactive ion etch (RIE). Sacrificial dielectric caps 24 on the top surfaces of the fins 22 are the remaining portions of the hard mask (HM). Fin heights are preferably equal. Fin heights, widths and spacing are further chosen in accordance with manufacturer preferences. Fin heights in some embodiments range between 10-50 nm. The substrate in one exemplary embodiment is a (100) substrate oriented such that the side walls of the mono-crystalline silicon fins 22 are (110) surfaces. The side walls of the fins 22 may not be exactly vertical. Surfaces described as (110) surfaces herein are at least close to being (110) surfaces but may or may not be exactly (110) surfaces. As shown in FIG. 1C, spaces 25 are formed between the side walls of the fins 22. Fin pitch is thirty-six nanometers (36 nm) or less in some embodiments. The nFET and pFET regions are separated by a trench 27 running perpendicularly to the semiconductor fins.

Bottom source/drain regions 21N, 21P of vertical transport field-effect transistors (VTFETs) are formed after FIN formation. In an exemplary embodiment, nFET regions of a silicon substrate 21 are doped with an n-type dopant such as phosphorus or arsenic that provides n-type conductivity. As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous. The dopant implanted in the nFET regions of the substrate 21 may, for example, be phosphorus in a concentration in the range of $1-5 \times 10^{21}$ cm$^{-3}$ or 2-10 atomic % of phosphorus in Si. Various techniques can be employed to incorporate dopants in semiconductors, including implantation and diffusion. Alternatively, a heavily doped source/drain layer can be formed by epitaxial growth on the substrate 21 and/or bottom regions of the semiconductor fins 22. The nFET and pFET regions are electrically isolated by shallow trench isolation regions 23 extending through the source/drain regions 21N, 21P and into the essentially undoped or lightly doped region of the substrate 21.

It will be appreciated that the substrate 21 and fins 22 formed therefrom may include one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. The semiconductor material chosen for the fins influences the choice of materials for other elements of the structure. Vertical transport devices can alternatively be formed on a semiconductor-on-insulator (SOI) substrate including a buried insulator layer.

A bottom spacer 28 is deposited over the bottom source/drain regions 21N, 21P. The bottom spacer 28 can be directionally deposited over the substrate by any non-conformal deposition methods that provide a faster deposition rate on the planar surface and slower deposition rate on the sidewall surfaces, including but not limited to plasma vapor deposition (PVD) and high density plasma (HDP) deposition. After directional deposition of bottom spacer material, an etch-back process can be performed to remove the any residue of spacer material from the fin side walls. In PVD, a pure source material is gasified via evaporation, the application of high power electricity, laser ablation, or the like. The gasified material will then condense on the substrate material to create the desired layer. Other deposition methods may alternatively be employed, such as chemical vapor deposition (CVD), plasma enhanced CVD or atomic layer deposition (ALD). The bottom spacer 28 can include a dielectric material, such as, for example, SiN, SiC, SiOC, SiCN, BN, SiBN, SiBCN, SiOCN, SiO$_x$N$_y$, and combinations thereof. The bottom spacer may have a thickness of about three to about ten nanometers, though such a range is not considered critical. The monolithic structure 20 may further include a top dielectric layer (not shown) between the top surfaces of the fins 22 and the bottom surfaces of the dielectric caps 24.

Referring to FIGS. 2A and 2B, a sacrificial gate liner comprising sacrificial vertical spacers 32 is formed on the semiconductor fins 22. In an exemplary embodiment, amorphous silicon germanium spacers are formed. The silicon germanium spacers have a composition that allows selective etching with respect to silicon in embodiments wherein the semiconductor fins are silicon fins. As discussed below, portions of the sacrificial vertical spacers 32 function as dummy gates that are later replaced by gate electrodes. The dummy gate portions of the vertical spacers 32 extend completely around the exposed portions of the semiconductor fins 22. The vertical spacers may have a thickness of about ten nanometers (10 nm). Portions of the spaces 25 between fin side walls remain following spacer formation as do portions of the trench 27 between opposing end portions of the arrays of fins in the nFET and pFET regions.

Conformal, amorphous SiGe (or Ge) may be deposited at relatively low temperature (<about 400° C.) to form the vertical spacers 32. Such films can be deposited using atomic layer deposition (ALD), chemical vapor deposition (CVD), plasma-enhanced chemical vapor deposition (PECVD), or any other suitable deposition method that provides conformal surface deposition at low temperature. While there may be some variation in film thickness on the horizontal and vertical surfaces of the structure, the film conforms to the surface of the structures on which it is deposited and there is film continuity over the exposed surfaces of the structure such that they are effectively covered and protected by the deposited film. Methods of conformally depositing continuous amorphous silicon germanium films are known to the art and continue to be developed. The amorphous film may or may not be entirely amorphous and may contain, for example, polycrystalline and/or microcrystalline regions within the otherwise predominantly amorphous film that do not affect film continuity. The conformally deposited film is subjected to a reactive ion etch (RIE) to form the sidewall spacers 32 on the vertical surfaces of the fins 22 and caps 24. The horizontal surfaces of the bottom spacer 28 and caps 24 are exposed following RIE. The vertical surfaces of the columns comprising the semiconductor fins 22 and dielectric caps 24 remain covered by the sidewall spacers 32 formed from the conformal film, as schematically illustrate in FIGS. 2A and 2B.

Figure 3A:
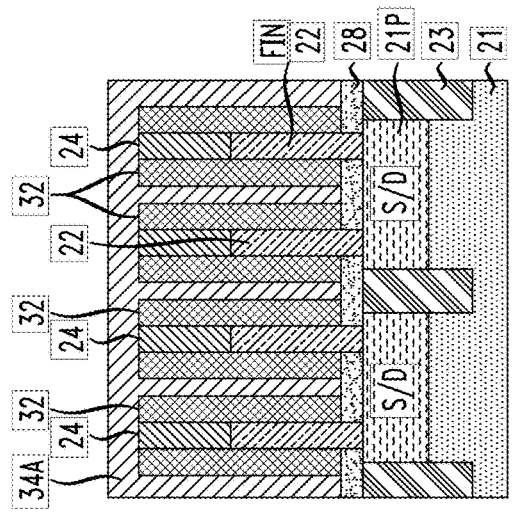

A first interlevel dielectric (ILD) layer 34A is conformally deposited on the structure, thereby filling the trenches 27 between the rows of semiconductor fins 22 and the spaces 25 between the fin side walls. The interlevel dielectric layer 34A may, for example, be comprise a conformal oxide such as ALD silicon dioxide in one exemplary embodiment. Other dielectric materials may alternatively be employed in some embodiments, though etch selectivity between the ILD layer and the caps 24 and vertical spacers 32 should be provided. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process and preferably much greater. The interlevel dielectric layer is deposited by any suitable deposition process including but not limited to CVD, PVD, plasma-enhanced CVD, atomic layer deposition (ALD), evaporation, chemical solution deposition, or like processes. A structure as schematically illustrated in FIGS. 3A and 3B is thereby obtained.

A timed, selective isotropic etch causes the removal of the exposed portion of the first ILD layer 34A. An etch chemistry that is selective to silicon nitride caps 24 and to amorphous silicon germanium spacer material is employed in an exemplary embodiment. FIGS. 4A and 4B schematically illustrate an exemplary structure 40 following isotropic etch-back of the first ILD layer 34A. The top surfaces of the caps 24, and portions of the bottom spacer 28, and vertical spacers 32 are exposed after this step has been completed.

Figure 5:
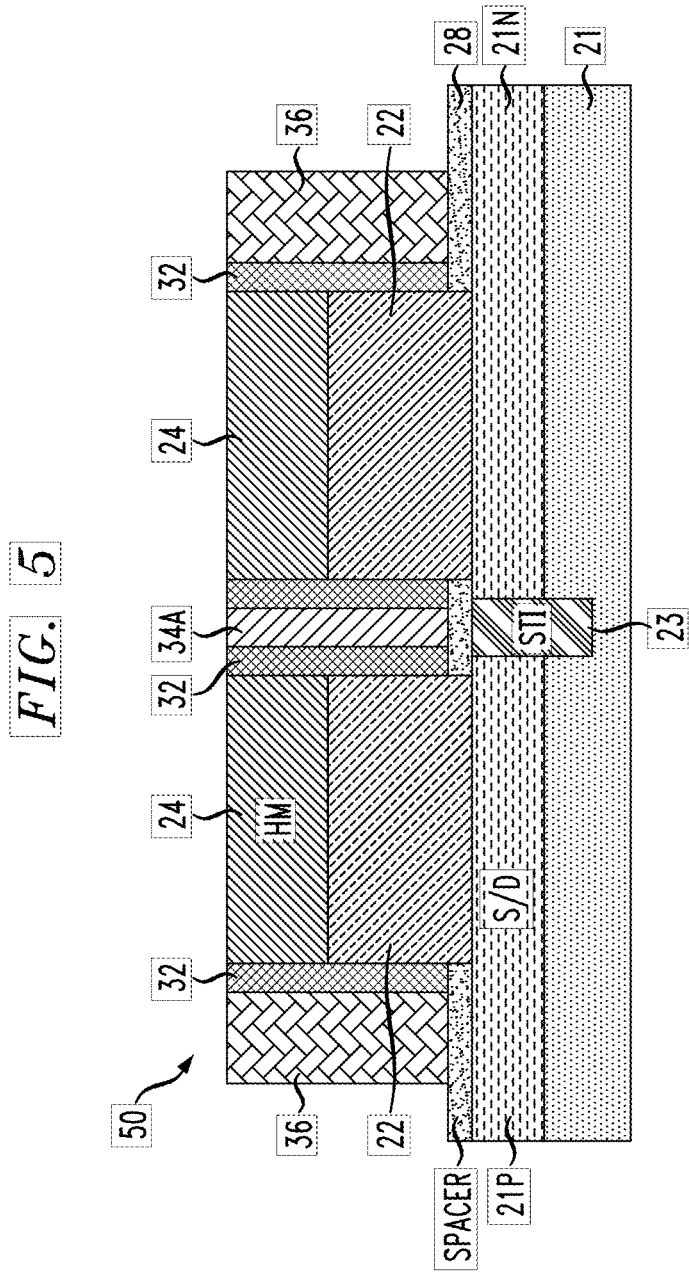
FIG. 5 is a sectional view showing the structure of FIG. 4B following formation of sacrificial spacer elements on edge portions of the structure.
Figure 6:
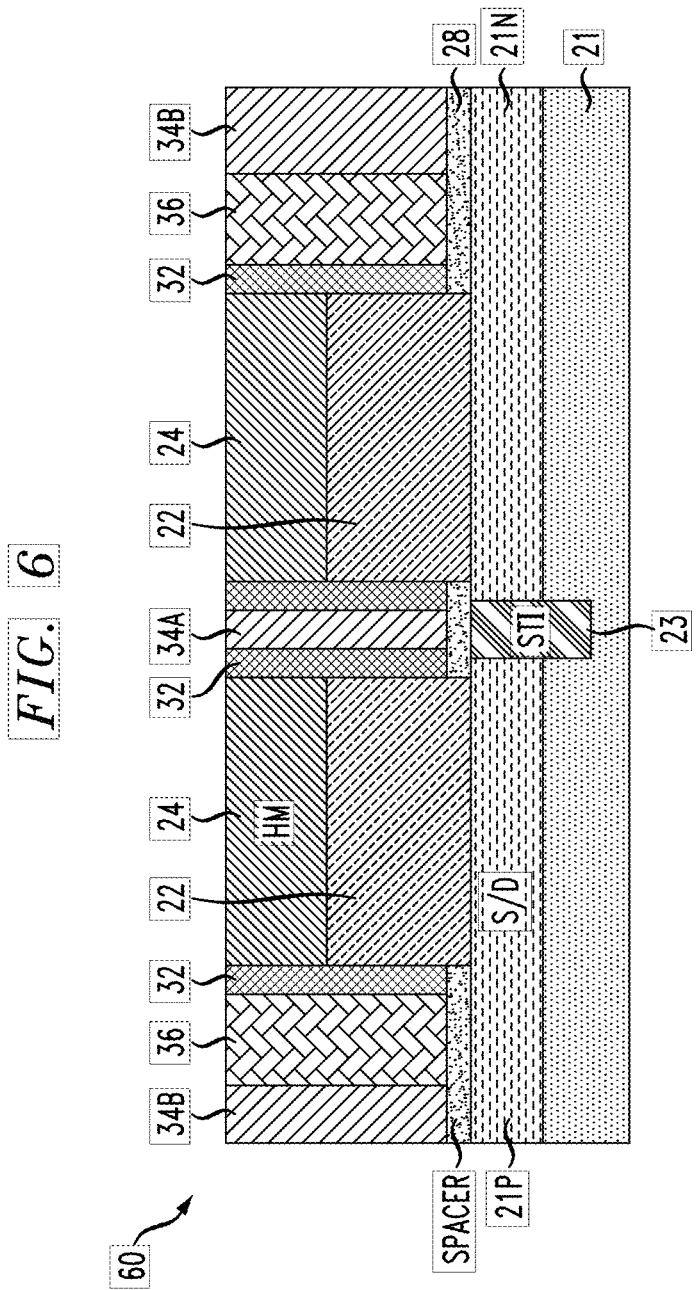
FIG. 6 is a sectional view showing the structure of FIG. 5 following deposition of a second fill layer and planarization.

A sacrificial spacer including sacrificial spacer elements 36 is formed at the edges of the structure 40. As shown in FIG. 5, the spacer elements are formed on the exposed top surfaces of the bottom spacer 28 and in adjoining relation to exposed outer surfaces of the vertical spacers 32. The sacrificial spacer elements 36 may comprise $TiO_x$, $AlO_x$, SiC and/or other material or combinations of materials that allow their selective removal later in the process. A second ILD layer 34B is deposited on the structure 50 and planarized to obtain a structure 60 as schematically illustrated in FIG. 6. The first and second ILD layers 34A, 34B may comprise the same dielectric material in some embodiments. The sacrificial spacer elements 36 are positioned between the second ILD layer 34B and end surfaces of the vertical spacers 32 that surround the semiconductor fins 22. The planarization of the structure may be performed using chemical mechanical planarization (CMP) and leaves the top surfaces of the caps 24, vertical spacers 32, and ILD layers 34A, 34B exposed.

The dielectric caps 24 are selectively removed from the structure 60 to obtain a structure 70 as illustrated in FIGS. 7A and 7B. In embodiments wherein a silicon nitride hard mask is employed, the dielectric caps formed therefrom can be selectively removed using hot $H_3PO_4$ wet chemistry or other suitable process. The top surfaces of the semiconductor fins 22 are exposed following dielectric cap removal.

Removal of the dielectric caps is followed by selective removal of portions of the vertical spacers 32. A timed, selective etch may be employed for indentation of the vertical spacers 32. A wet etch process containing ammonia and hydroperoxide can be used to etch SiGe selective to other materials, including silicon. The top surfaces and upper side wall regions of the semiconductor fins 22 are exposed after removal of the adjoining caps 24 and spacer portions. The channel regions of the semiconductor fins 22 remain encapsulated by the remaining portions of the vertical spacers 32, which function as dummy gate portions. The ILD layer 34 (comprising the first and second ILD layers 34A, 34B) remains essentially intact during removal of the vertical spacer portions and the dielectric caps 24 from the upper fin regions.

Top spacers 38 are formed on the side walls of the ILD layer and the sacrificial spacer elements 36, as shown in the structure 80 illustrated in FIGS. 8A and 8B. The top spacers 38 and bottom spacer 28 comprise the same dielectric material(s) in some embodiments and the spacer material may be deposited using the same techniques. The top spacers 38 adjoin the upper side wall portions of the semiconductor fins 22 and the top surfaces of the indented vertical spacers 32. The top surfaces of the semiconductor fins 22 are exposed following top spacer formation. Spacer material above the top surfaces of the semiconductor fins and other horizontal surfaces can be removed using a reactive ion etch.

Top source/drain regions 221N are epitaxially grown on the exposed top surfaces of the semiconductor fins 22 in the nFET region. The epitaxially grown source/drain layer 221N can be doped in situ, and dopants may include, for example, an n-type dopant selected from a group of phosphorus (P), arsenic (As) and antimony (Sb). In a non-limiting example, a dopant concentration range may be $e20/cm^3$ to $e21/cm^3$, with $4e20/cm^3$ to $8e20/cm^3$ preferred. Dielectric caps 211N are formed on the source/drain regions 221N.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). By "in-situ" it is meant that the dopant that dictates the conductivity type of doped layer is introduced during the process step, for example epitaxial deposition, that forms the doped layer.

Source/drain epitaxy occurs on the top surfaces of the semiconductor fins 22 in the nFET region and within recesses formed in the ILD layer 34. Top source/drain regions 221P are formed in the pFET region in a similar manner. A protective liner (not shown) may be formed over the structure and the layers directly above the semiconductor fins 22 in the nFET region. Following exposure of the top surfaces of the fins 22 in the pFET region, the top source/drain regions 221P is epitaxially grown, followed by a dielectric cap 211P formation Dielectric cap 211P and 211N can be formed by dielectric deposition followed by CMP. The top source/drain regions 221P of the transistors formed in the pFET region include a p-type dopant selected, for example, from a group of boron (B), gallium (Ga), indium (In), and thallium (Tl) at various concentrations. In some embodiments, the top source/drain regions 221P comprise silicon germanium. The temperature for epitaxial silicon germanium deposition typically ranges from 450° C. to 900° C. Although higher temperature typically results in faster deposition, the faster deposition may result in crystal defects and film cracking. FIGS. 9A and 9B include schematic, cross-sectional illustrations of an exemplary monolithic structure 90 following epitaxial top source/drain and cap growth in the nFET and pFET regions.

Figure 10:
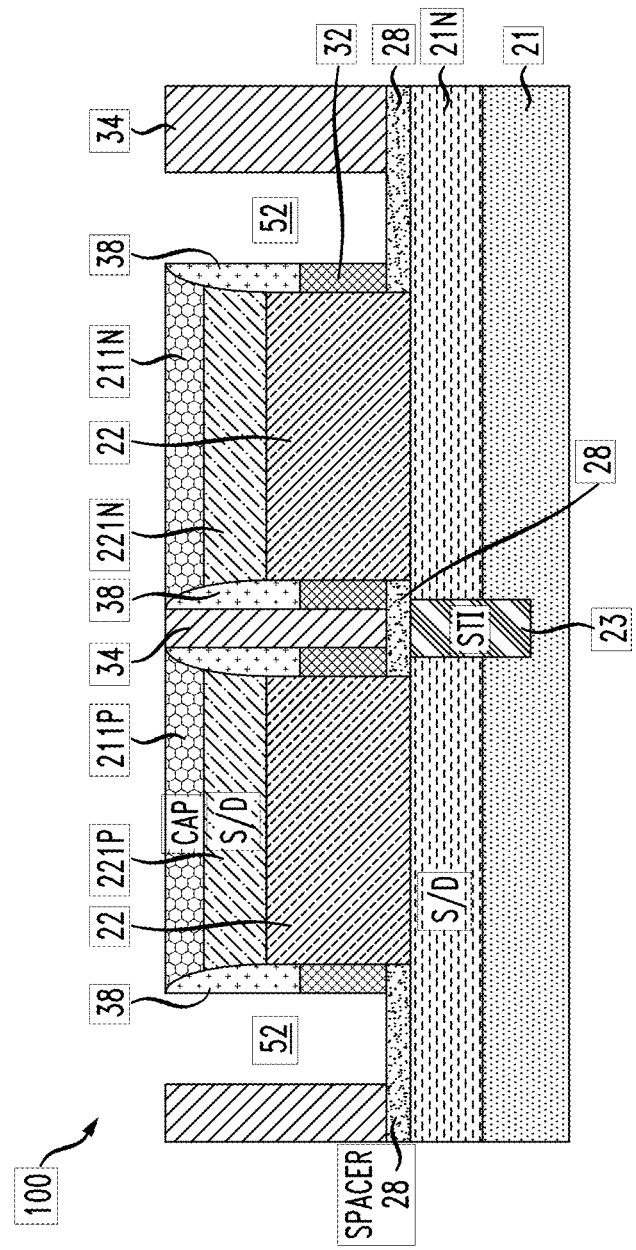
FIG. 10 is a sectional view showing the structure of FIG. 9B following removal of the sacrificial spacer elements from the edge portions of the structure.

The sacrificial spacer elements 36 are selectively removed from the structure 90 to obtain a structure 100 including trenches at the fin end portions, as schematically illustrated in FIG. 10. SC1 wet clean can be used to remove $TiO_x$ or $AlO_x$ spacer elements. The remaining (dummy gate) portions of the vertical spacers 32 are then removed, thereby exposing the side walls and end walls of the channel regions of the semiconductor fins 22. Open spaces are formed between the bottom and top spacers 28, 38 and adjoin the channel regions. The open spaces have uniform dimensions in one or more exemplary embodiments. FIGS. 11A and 11B illustrate an exemplary monolithic structure 110 following release of the vertical spacers 32. A wet etch process containing ammonia and hydroperoxide or a vapor phased HCl dry etch can be used to etch silicon germanium spacer portions selective to other materials within the structure 100 shown in FIG. 10. As shown in FIGS. 10 and 11B, trenches 52 are formed by the selective removal of the spacer elements 36. Removal of the remaining sacrificial gate portions of the spacers 32 causes lateral extension of the trenches. The trenches 52 are formed near the end walls of the semiconductor fins 22 and are bounded by vertical side wall surfaces of the ILD layer 34. The trenches 52 allow a subsequent replacement metal gate (RMG) process to be performed without further removal of the ILD layer 34, as discussed below.

A gate dielectric layer 43 and work function metal (WFM) layers 42N, 42P are deposited sequentially to form gate stacks for the VTFET devices. The gate stacks completely fill the open spaces adjoining the channel regions of the semiconductor fins 22. The gate dielectric layer 43 adjoins the sidewalls of the channel regions of the semiconductor fins 22 between the top and bottom spacers 38, 28. Non-limiting examples of suitable materials for the gate dielectric layer include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 43 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Work function metal (WFM) layers 42N, 42P are disposed over the gate dielectric layer in both the nFET and pFET regions to complete the gate stacks. Non-limiting examples of suitable work function metals include p-type work function metal materials and n-type work function metal materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

Figure 12B:
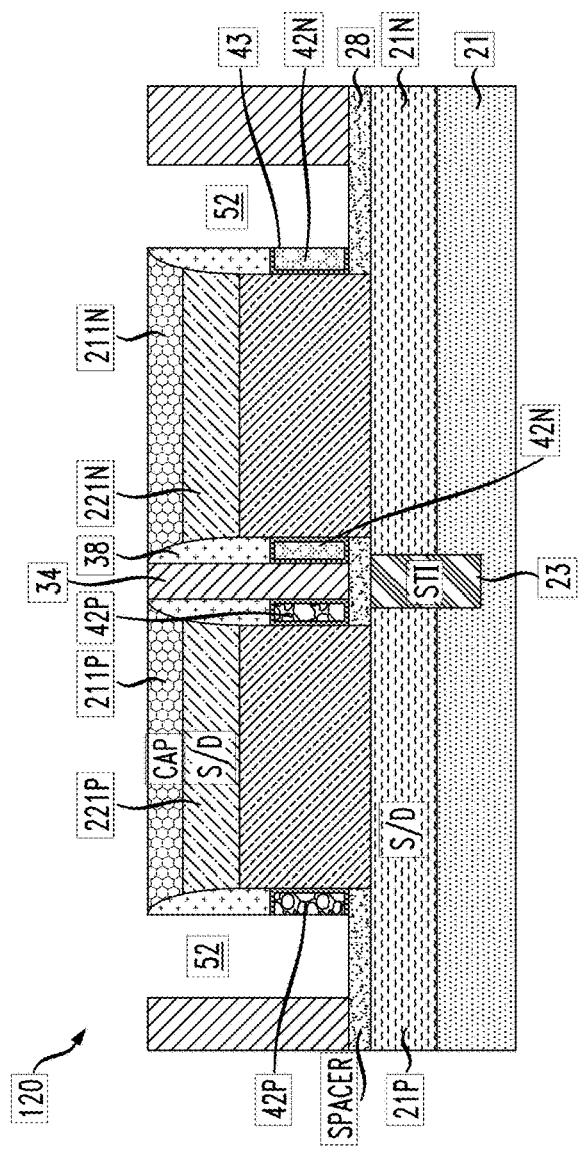
FIGS. 12A and 12B are sectional views showing the structure of FIGS. 11A and 11B, respectively, following formation of replacement gates and a reactive ion etch of the replacement gates.

The work function metal(s) may be deposited by a suitable deposition process, for example, ALD, CVD, PECVD, PVD, plating, and thermal or e-beam evaporation. Pinch-off of work function metal material between semiconductor fins is essentially avoided during deposition. The WFM layer is removed from one of the nFET and pFET regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in the nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The portion of the ILD layer 34 separating the nFET and pFET regions, as shown in FIG. 12B, facilitates workfunction patterning without concern of WFM undercut. The threshold voltage (Vt) of nFET devices is sensitive to the thickness of work function metals such as titanium nitride (TiN). It should further be noted that the portions of the WFM layer covering the tip portions of the fins 22, as shown in the exemplary structure 120 depicted in FIG. 12B, are not significant contributors to setting the threshold voltage Vt of the devices. Should these portions of the WFM layer be damaged by gate RIE, the performance of the resulting VTFET will still be satisfactory.

Figure 12A:
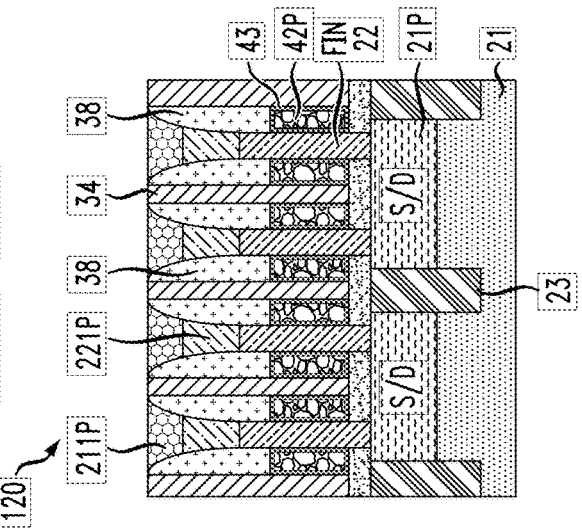

Referring to FIGS. 13 and 13-1, continuous, dielectric edge spacers 44 are formed at the opposing edges of the structure 120 shown in FIGS. 12A and 12B. The edge spacers 44 are formed within the trenches 52 between vertical side wall portions of the ILD layer 34 and the semiconductor fin end portions. (The sacrificial spacers 36 filled these trenches prior to the replacement metal gate process described above.) The opposing side walls of each trench 52 are lined with a pair of the dielectric edge spacers 44. One of the spacers 44 in each trench adjoins the gate stacks and the top spacers 38 of VTFETs in an nFET or pFET region. The gate stack portions at the edge portions of the structure 130 are accordingly encapsulated by the top and bottom spacers 38, 28 as well as the edge spacers 44, as shown in FIG. 13. The dielectric spacers 44 in each trench are parallel, extend upwardly from the bottom spacer 28, and have top surfaces that are coplanar with the top surface of the ILD layer 34. The edge spacers 44 may comprise the same material(s) as the bottom spacer 28. As schematically exemplified in FIG. 13-1, a cell 130 may include a first set of semiconductor fins 22 in an nFET region and a second set of semiconductor fins in a pFET region. A first continuous edge spacer 44 adjoins the nFET region and runs perpendicularly to the semiconductor fins therein. A second continuous spacer adjoins the pFET region and runs perpendicularly to the semiconductor fins 22 in that region. The nFET and pFET regions are electrically isolated by a portion of the ILD layer 34 and an STI region 23, as shown in FIG. 13.

Referring to the top plan, schematical view of the cell depicted in FIG. 14, a vertical trench 46 is formed on each end of the cell 130. Each trench is formed between a pair of the edge spacers 44 and is aligned with one of the spaces 25 between semiconductor fins 22. The vertical trenches 46 are accordingly in offset relation to the ends of the semiconductor fins 22 and aligned with each other at opposite ends of one of the spaces 25. Each trench may extend to about the same depth within the semiconductor substrate 21 as the STI regions 23. The vertical trenches are filled with a dielectric material, for example an oxide or a nitride. The width of each vertical trench 46 is the same as the distance between opposing pairs of edge spacers 44. The length of each trench is no more than the distance between opposing fin side walls (the width of space 25 shown in FIG. 1C) in one or more exemplary embodiments.

Figure 15C:
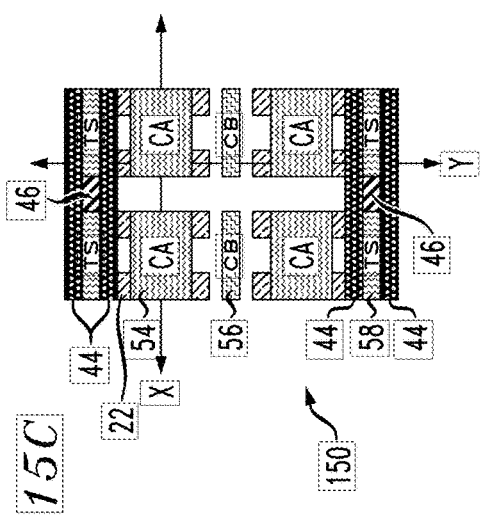
FIG. 15C is a top plan view showing selected elements of the structure depicted in FIGS. 15A and 15B.
Figure 15B:
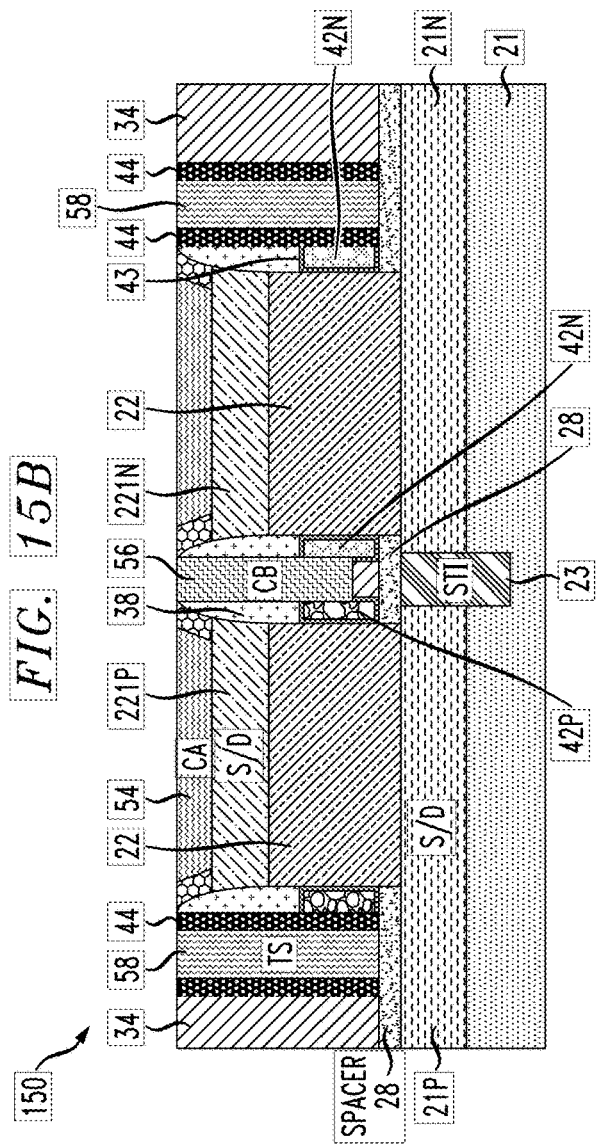
FIGS. 15A and 15B are sectional views showing the structure of FIG. 14 following patterning of contacts and metallization.
Figure 15A:
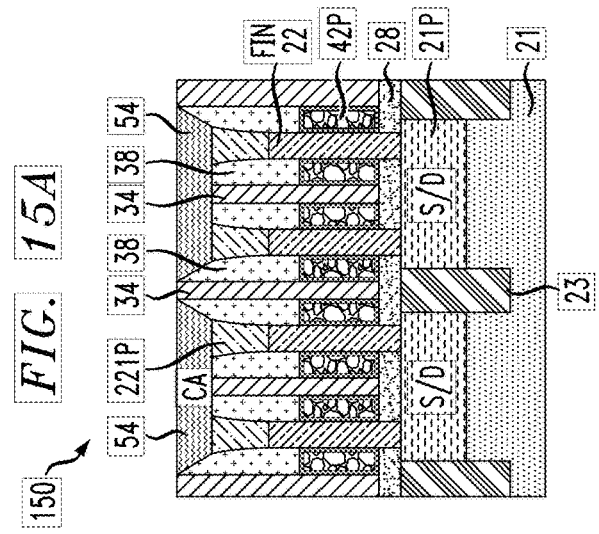
Figure 16A:
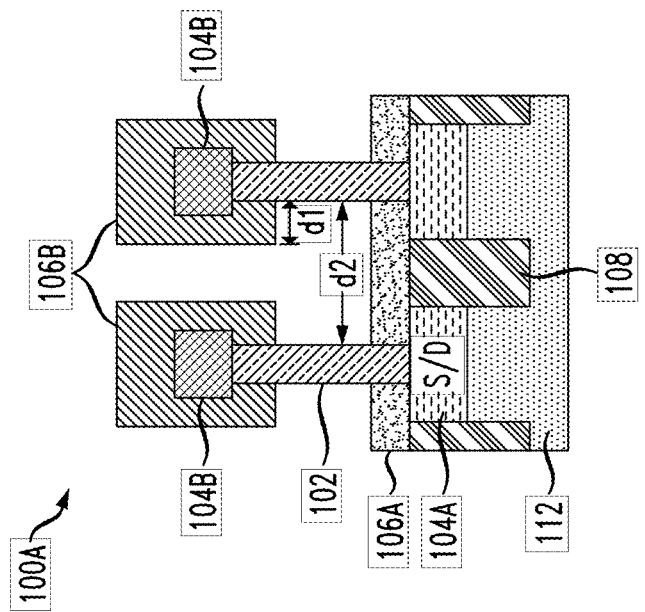
FIGS. 16A and 16B are sectional views illustrating a sequence of steps employed in a prior art process of fabricating VTFET devices.
Figure 16B:
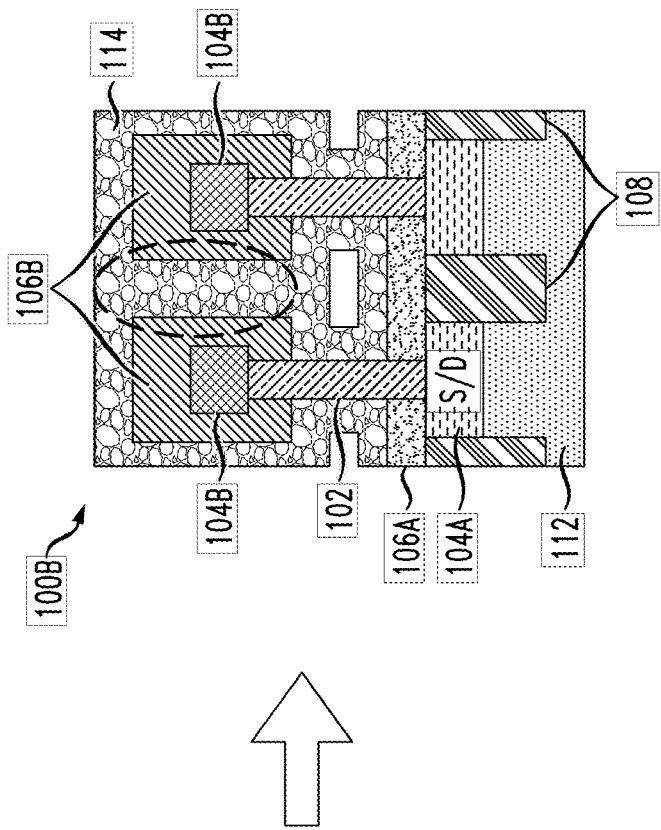

Top source/drain contacts, bottom source/drain contacts and gate contacts are formed to obtain a structure 150 as exemplified in FIGS. 15A, 15B and 15C. An interlevel dielectric (ILD) layer (not shown) may be deposited on the structure 140 followed by a CMP process. Trenches are formed in the ILD layer. Some trenches extend down to the top surfaces of the top source/drain regions 221N, 221P of the nFET and pFET devices, respectively. The regions between the edge spacers 44 and between the sets of semiconductor fins 22 in the nFET and pFET regions are also exposed. Portions of the ILD layer 34 between the nFET and pFET regions are selectively removed Top source/drain contacts 54 (CA) are formed using suitable metallization processes. In one or more embodiments, an electrically conductive metal such as nickel, nickel platinum, or titanium is deposited on the top source/drain regions 221N, 221P following removal of the epitaxial caps. Electroless deposition processes and atomic layer deposition (ALD) are among the techniques that may be employed. Metal deposition may be followed by low temperature silicidation to form metal silicide or metal germanide layers (not shown) on the top source/drain regions 221N, 221P. Annealing temperatures between 300-420° C. form uniform layers of metal-rich silicides. Annealing could be performed using a laser spike anneal in the range of 700° C. to 1100° C. in some embodiments.

A contact metal layer, for example tungsten (W) or cobalt (Co), is deposited on the structure, filling the trenches formed the ILD layer and directly contacting the metal silicide layers formed on the top source/drain regions 221N, 221P. In some embodiments, the contact metal layer is a tungsten (W) layer that is deposited using a tungsten hexafluoride source with silane. Chemical vapor deposition conducted between 300-400° C. and using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A planarization process such as CMP is performed to remove any electrically conductive material (overburden) from the top surface of the structure. Gate and bottom source/drain via conductors and contacts 56, 58 (CB, TS) are also formed within the structure. A monolithic structure 150 as schematically illustrated in FIGS. 15A, 15B and 15C may be obtained following transistor wiring.

As shown in one or more of the exemplary figures, the bottom source/drain conductors/contacts 58 are located between the pairs of continuous edge spacers 44. As shown in the top plan view of FIG. 15C, the cut regions (dielectric-filled trenches 46) separate the left device with right device.

The cut region preventing shorting of the bottom source/drain contacts of the left and right devices. The top source/drain contacts 54 adjoin the top source/drain regions and occupy the spaces created upon removal of the epitaxial caps 211P, 211N. The gate contacts 56 are formed above the STI region 23 that divides the nFET and pFET regions of the structure and extend down to underlying portions of the ILD layer 34. Portions of the ILD layer 34 between the nFET and pFET regions are removed during prior gate patterning. Each gate contact adjoins gate electrodes of VTFET transistors within the structure 150. The gate dielectric layer 43 fully wraps around the gate electrodes 42P, 42N except for the edges adjoining the continuous spacers 44 and gate contacts 56.

The electronic devices comprising the structure 150 shown in FIGS. 15A, 15B and 15C may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of forming replacement gates for vertical transport field-effect transistors includes forming a sacrificial gate liner on parallel semiconductor fins 22 arranged in nFET and pFET regions within a cell to obtain a structure such as that illustrated in FIG. 2. A first dielectric layer is formed, thereby pinching off spaces between the parallel semiconductor fins and between the nFET and pFET regions, such as shown in FIGS. 3A and 3B. A sacrificial spacer is formed at an edge of the cell and abuts the sacrificial gate liner, as shown in FIGS. 5A and 5B. Top source/drain layers 221N, 221P are formed on the semiconductor fins between portions of the top spacer layer 38, as shown in FIG. 9. Following removal of the sacrificial spacer, the sacrificial gate liner is replaced with a gate stack including a gate dielectric layer 43 and gate metal. The gate stack is encapsulated with a first continuous dielectric spacer 44, such as shown in FIG. 13B.

A further exemplary method of fabricating a vertical transport field-effect transistor structure includes obtaining a semiconductor structure including an nFET region including vertically extending, parallel semiconductor fins 22, a pFET region including vertically extending, parallel semiconductor fins, vertical transport field-effect transistor structures in each of the nFET and pFET regions, each of the vertical transport field-effect transistor structures including a bottom source/drain region (21N. 21P), a top source/drain region (221N, 221P), a channel between the bottom source/drain region and the top source/drain region, a sacrificial gate (32) adjoining the channel region, a bottom dielectric spacer 28 between the bottom source/drain region and the sacrificial gate and a top dielectric spacer 38 above the sacrificial gate and adjoining the top source drain region. The structure further includes sacrificial spacer elements 36 that adjoin, respectively, an edge portion of the nFET region and an edge portion of the pFET region. Each of the sacrificial spacer elements further adjoins the sacrificial gate of a plurality of the vertical transport field-effect transistor structures. An exemplary structure 90 including VTFET structures as described above is schematically illustrated in FIGS. 9A and 9B.

The sacrificial spacer elements are removed, thereby exposing the outer surfaces of each sacrificial gate 32, as illustrated in FIG. 10. The sacrificial gates are then removed from each of the vertical transport field-effect transistor structures (FIGS. 11A and 11B) and replaced with a gate stack including a gate dielectric layer (42N, 42P) and a gate electrode layer 43 to obtain a structure 120 as illustrated in FIGS. 12A and 12B. First and second continuous spacers 44 are formed at the edge portions of the nFET region and the pFET region. The first and second continuous spacers adjoin the gate stacks, as shown in FIG. 13.

The exemplary method includes a replacement metal gate (RMG) process that employs trenches 52 extending along the outer end walls of the semiconductor fins to facilitate sacrificial gate removal and formation of the gate dielectric and work function metal layers. Such trenches are illustrated, for example, in FIGS. 10, 11B and 12B. The trenches extend down to the bottom spacer 28. The interlevel dielectric layer 34, which extends between each of the semiconductor fins and in the boundary region between the nFET and pFET regions, does not require removal prior to the RMG process as described herein at etchants and materials to be deposited enter the structure through the trenches. In one or more embodiments, removal of sacrificial spacer elements 36 forms first and second trenches within the dielectric layer 34. Bottom source/drain contacts 58 can be formed within the trenches and adjoin, respectively, the first and second continuous side wall spacers 44 as schematically illustrated in FIGS. 15B and 15C.

A method of forming replacement gates for vertical transport field-effect transistor structures in accordance with the invention includes obtaining a semiconductor structure such as that shown in FIGS. 9A and 9B. The structure 90 includes a plurality of parallel, vertically extending semiconductor fins 22, bottom source/drain regions 21N, 21P, top source/drain regions 221N, 221P, channel regions within the semiconductor fins, sacrificial gates 32 extending, respectively, around the channel region of each of the semiconductor fins, and a dielectric layer 34 having portions extending between the side walls of the semiconductor fins (as shown in FIG. 9A). A trench is formed in the structure and extends perpendicularly to the semiconductor fins 22 and in opposing relation to the end walls of the semiconductor fins, thereby exposing portions of the sacrificial gates 32. Selective removal of the sacrificial gates exposes the channel regions of the semiconductor fins and forms spaces between the side walls of the semiconductor fins and portions of the dielectric layer 34, such as shown in FIG. 11A. A gate stack including gate dielectric and work function metal layers is deposited over the channel regions of the semiconductor fins. The RMG method may further include forming a first continuous spacer 44 within the trench subsequent to depositing the gate stack. The first continuous spacer adjoins a portion of each of the gate stacks and may directly contact the work function metal layer 42N or 42P. The structure prior to gate replacement further includes a horizontally extending bottom dielectric spacer 28 and top dielectric spacers 38 in one or more embodiments. The top dielectric spacers adjoin the top source/drain regions. The selective removal of the sacrificial gates 32 further includes forming the spaces between the bottom dielectric spacer 28 and the top dielectric spacers 38 as illustrated in FIGS. 11A and 11B. The regions between the top dielectric spacers 38 are pinched off by portions of the dielectric layer 34. The lateral distances between top dielectric spacers 38 are accordingly not critical to formation of the replacement gates as gate stack materials are introduced through trenches in fluid communication with the spaces surrounding the channel regions rather than through openings between top dielectric spacers.

Further given the above discussion, an array of vertical transport field-effect transistors comprises an nFET region including a first edge portion, a pFET region including a second edge portion, and a boundary region between the nFET region and the pFET region. Each of the nFET and pFET regions includes vertically extending, parallel semiconductor fins 22. The semiconductor fins include side walls and inner and outer end walls. The inner end walls of the semiconductor fins in the nFET and pFET regions adjoin the boundary region and may be in opposing relation to each other as schematically illustrated in FIG. 15B. The nFET region includes a first plurality of the VTFETs and the pFET region includes a second plurality of the VTFETs. Each of the first plurality and second plurality of VTFETs comprises a bottom source/drain region (21N, 21P), a top source/drain region (221N, 221P), and a channel between the bottom source/drain region and the top source/drain region. The channel comprises a channel region of one of the semiconductor fins. A gate stack adjoins the channel region of each VTFET. A first trench is in opposing relation to the outer end walls of the semiconductor fins in the nFET region and extends perpendicularly to the semiconductor fins in the nFET region. A second trench is in opposing relation to the outer end walls of the semiconductor fins in the pFET region and extends perpendicularly to the semiconductor fins in the pFET region. A first continuous dielectric side wall spacer 44 within the first trench adjoins each gate stack of the first plurality of vertical field-effect transistors in the nFET region. A second continuous dielectric side wall spacer 44 within the second trench and adjoins each gate stack of the second plurality of vertical field-effect transistors in the pFET region. FIGS. 15A, 15B and 15C provide different views of an exemplary structure 150.

The array of vertical transport field-effect transistors may further include a first, electrically conductive bottom source/drain contact 58 within the first trench and a second, electrically conductive bottom source/drain region 58 within the second trench. In some exemplary embodiments, a first outer dielectric side wall spacer 44 is within the first trench and a second outer dielectric side wall spacer is within the second trench. The source/drain contacts 58 are positioned between pairs of such side wall spacers in one or more embodiments, as schematically illustrated in FIGS. 15B and 15C.

In accordance with further aspects of the invention, an array of vertical transport field-effect transistors a semiconductor substrate 21 and parallel semiconductor fins 22 extending vertically with respect to the semiconductor substrate. Each of the semiconductor fins includes side walls and inner and outer end walls. The array further includes a plurality of the vertical transport field-effect transistors. Each of the VTFETs includes a bottom source/drain region 21N or 21P, a top source/drain region 221N or 221P, and a channel between the bottom source/drain region and the top source/drain region. The channel includes a channel region of one of the semiconductor fins 22. A gate stack (42N or 42P and 43) adjoins the channel region. A first pair of parallel, continuous dielectric side wall spacers 44 extends perpendicularly with respect to the semiconductor fins and vertically with respect to the semiconductor substrate, as shown in FIGS. 15B and 15C. The first pair of parallel, continuous dielectric side wall spacers is proximal to the outer end walls of a first plurality of the semiconductor fins 22 and bounds a first trench (52 in FIG. 13). One of the first pair of parallel, continuous dielectric side wall spacers adjoins a plurality of the gate stacks of a first plurality of the vertical field-effect transistors. A second pair of parallel, continuous dielectric side wall spacers 44 extending perpendicularly with respect to the semiconductor fins and vertically with respect to the semiconductor substrate is proximal to the outer end walls of a second plurality of the semiconductor fins and bounds a second trench. One of the second pair of parallel, continuous dielectric side wall spacers 44 adjoins a plurality of the gate stacks of a second plurality of the vertical field-effect transistors. A first bottom source/drain contact layer 58 is between the first pair of parallel, continuous side wall spacers and a second bottom source/drain contact layer 58 is between the second pair of parallel, continuous side wall spacers 44. A first recess 46 extends vertically from the first trench into the semiconductor substrate 21 and is filled with electrically insulating material. The first bottom source/drain contact layer 58 includes a first portion on one side of the first recess and a second portion electrically isolated from the first portion on an opposite side of the first recess, as shown in FIG. 15C. A second recess 46 extends vertically from the second trench into the semiconductor substrate and is also filled with electrically insulating material. The second bottom source/drain contact layer includes a first portion on one side of the second recess 46 and a second portion electrically isolated from the first portion on an opposite side of the second recess.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having VTFETs therein.

An integrated circuit in accordance with aspects of the present inventions can be employed in essentially any application and/or electronic system where the use of VTFETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A vertical device comprising:
   a cell comprising nFET and pFET regions;
   vertical transport field-effect transistors within the nFET and pFET regions, the vertical transport field-effect transistors including gate stacks comprising gate dielectric layers and gate metal layers;
   a first cell edge adjoining the nFET region and including a first pair of parallel continuous dielectric spacers, one of the first pair of continuous dielectric spacers being in direct contact with the gate metal layers in the nFET region;
   a second cell edge adjoining the pFET region and including a second pair of parallel continuous dielectric spacers, one of the second pair of continuous dielectric spacers being in direct contact with the gate metal layers in the pFET region;
   a first electrically conductive bottom source/drain contact in a first trench between the first pair of continuous dielectric spacers;
   a second electrically conductive bottom source/drain contact in a second trench between the second pair of continuous dielectric spacers;
   a semiconductor substrate beneath the first and second pairs of continuous dielectric spacers; and
   parallel semiconductor fins extending vertically from the semiconductor substrate, the semiconductor fins including channel regions adjoining the gate stacks, the first and second pairs of continuous dielectric spacers running perpendicular to the parallel semiconductor fins when viewed in a top plan view.

2. An array of vertical transport field-effect transistors, comprising:
   a semiconductor substrate;
   parallel semiconductor fins extending vertically with respect to the semiconductor substrate, each of the semiconductor fins including side walls and inner and outer end walls;
   a plurality of vertical transport field-effect transistors, each of the vertical transport field-effect transistors comprising a bottom source/drain region, a top source/drain region, and a channel between the bottom source/drain region and the top source/drain region, the channel comprising a channel region of one of the semiconductor fins, and a gate stack adjoining the channel region;
   a first pair of parallel, continuous dielectric side wall spacers extending perpendicularly with respect to the semiconductor fins when viewed in a top plan view and vertically with respect to the semiconductor substrate, the first pair of parallel, continuous dielectric side wall spacers being proximal to the outer end walls of a first plurality of the semiconductor fins and bounding a first trench, one of the first pair of parallel, continuous dielectric side wall spacers adjoining a plurality of the gate stacks of a first plurality of the vertical transport field-effect transistors;
   a second pair of parallel, continuous dielectric side wall spacers extending perpendicularly with respect to the semiconductor fins when viewed in a top plan view and vertically with respect to the semiconductor substrate, the second pair of parallel, continuous dielectric side wall spacers being proximal to the outer end walls of a second plurality of the semiconductor fins and bounding a second trench, one of the second pair of parallel, continuous dielectric side wall spacers adjoining a plurality of the gate stacks of a second plurality of the vertical transport field-effect transistors;
   a first bottom source/drain contact layer between the first pair of parallel, continuous side wall spacers;
   a second bottom source/drain contact layer between the second pair of parallel, continuous side wall spacers;
   a first recess extending vertically from the first trench into the semiconductor substrate, the first recess being filled with electrically insulating material;
   a second recess extending vertically from the second trench into the semiconductor substrate, the second recess being filled with electrically insulating material.

3. The array of vertical transport field-effect transistors of claim 2, wherein the plurality of the vertical transport field-effect transistors comprise n-type vertical transport field-effect transistors and p-type vertical transport field-effect transistors, the n-type vertical transport field-effect transistors being within an nFET region and the p-type vertical transport field-effect transistors being within a pFET region, the first pair of parallel, continuous dielectric side wall spacers adjoining the nFET region and the second pair of parallel, continuous side wall spacers adjoining the pFET region.

4. The array of vertical transport field-effect transistors of claim 3, wherein each of the gate stacks includes a work function metal and a gate dielectric layer, one of the first pair of parallel, continuous dielectric side wall spacers directly contacting the work function metal of the gate stacks in the nFET region and one of the second pair of parallel, continuous dielectric side wall spacers directly contacting the work function metal of the gate stacks in the pFET region.

5. The array of vertical transport field-effect transistors of claim 3, further comprising an interlevel dielectric layer between the semiconductor fins and adjoining the first and second pairs of parallel, continuous dielectric side wall spacers, the dielectric side wall spacers having top surfaces coplanar with a top surface of the interlevel dielectric layer.

6. The array of vertical transport field-effect transistors of claim 5, wherein each of the vertical transport field-effect transistors further comprises a top dielectric spacer above the gate stack and adjoining the top source/drain region, one of the first pair of parallel, continuous dielectric side wall spacers directly contacting a plurality of the top dielectric spacers in the nFET region and one of the second pair of parallel, continuous dielectric side wall spacers directly contacting a plurality of the top dielectric spacers in the pFET region.

7. The array of vertical transport field-effect transistors of claim 2, wherein the first and second recesses are in an offset relation to ends of the semiconductor fins in the top plan view.

8. The array of vertical transport field-effect transistors of claim 7, further comprising a bottom dielectric spacer outward of the substrate, wherein the first and second pairs of parallel continuous dielectric spacers extend from the bottom dielectric spacer and the first and second electrically conductive bottom source/drain contacts terminate at the bottom dielectric spacer when viewed in cross section along the fins.

9. The vertical device of claim 1, further comprising:
   a first recess extending vertically downwardly from the first trench and into the semiconductor substrate;
   a second recess extending vertically downwardly from the second trench and into the semiconductor substrate; and
   electrically insulating material filling the first and second recesses;

wherein the first and second recesses are in an offset relation to ends of the semiconductor fins in the top plan view.

10. The vertical device of claim 9, further comprising a bottom dielectric spacer outward of the substrate, wherein the first and second pairs of parallel continuous dielectric spacers extend from the bottom dielectric spacer and the first and second electrically conductive bottom source/drain contacts terminate at the bottom dielectric spacer when viewed in cross section along the fins.

\* \* \* \* \*